(12) United States Patent
Sasaki

(10) Patent No.: US 8,497,196 B2
(45) Date of Patent: Jul. 30, 2013

(54) SEMICONDUCTOR DEVICE, METHOD FOR FABRICATING THE SAME AND APPARATUS FOR FABRICATING THE SAME

(75) Inventor: Masaru Sasaki, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 663 days.

(21) Appl. No.: 12/573,138

(22) Filed: Oct. 4, 2009

(65) Prior Publication Data

US 2011/0079826 A1 Apr. 7, 2011

(51) Int. Cl.
*H01L 21/3205* (2006.01)

(52) U.S. Cl.
USPC ............ 438/585; 438/515; 438/513; 438/680; 257/288; 257/E29.255; 257/E21.158; 257/E21.409

(58) Field of Classification Search
USPC .......... 438/585, 515, 513, 680; 257/E21.158, 257/E21.409, 288, E29.255
See application file for complete search history.

(56) References Cited

U.S. PATENT DOCUMENTS

| | | | |
|---|---|---|---|
| 6,534,420 B2 * | 3/2003 | Ahn et al. ..................... 438/768 |
| 7,217,659 B2 * | 5/2007 | Sugawara et al. ............. 438/680 |
| 7,223,676 B2 * | 5/2007 | Hanawa et al. ................ 438/515 |
| 7,226,874 B2 * | 6/2007 | Matsuyama et al. .......... 438/786 |
| 2004/0048452 A1 | 3/2004 | Sugawara et al. |
| 2006/0105516 A1 * | 5/2006 | Belyansky et al. ............ 438/199 |
| 2006/0118880 A1 | 6/2006 | Komoda |
| 2006/0246738 A1 * | 11/2006 | Isobe et al. .................... 438/769 |
| 2011/0053381 A1 | 3/2011 | Kobayashi et al. |

FOREIGN PATENT DOCUMENTS

| | | |
|---|---|---|
| EP | 1361606 | 11/2003 |
| JP | 10-022382 | 1/1998 |
| JP | 10-135189 | 5/1998 |
| KR | 10-2006-0009395 | 1/2006 |
| KR | 10-0676385 B1 | 6/2006 |
| WO | WO 2009/099252 | 8/2009 |

* cited by examiner

Primary Examiner — Thinh T Nguyen

(74) Attorney, Agent, or Firm — Ditthavong Mori & Steiner, P.C.

(57) ABSTRACT

A method for fabricating a semiconductor device includes forming a gate electrode on a surface of a substrate via a gate insulating film, forming an insulating film on a side surface of the gate electrode, and exposing an oxygen plasma onto the surface of the substrate. An electron temperature of the oxygen plasma in a vicinity of the surface of the substrate is equal to or less than about 1.5 eV.

15 Claims, 10 Drawing Sheets

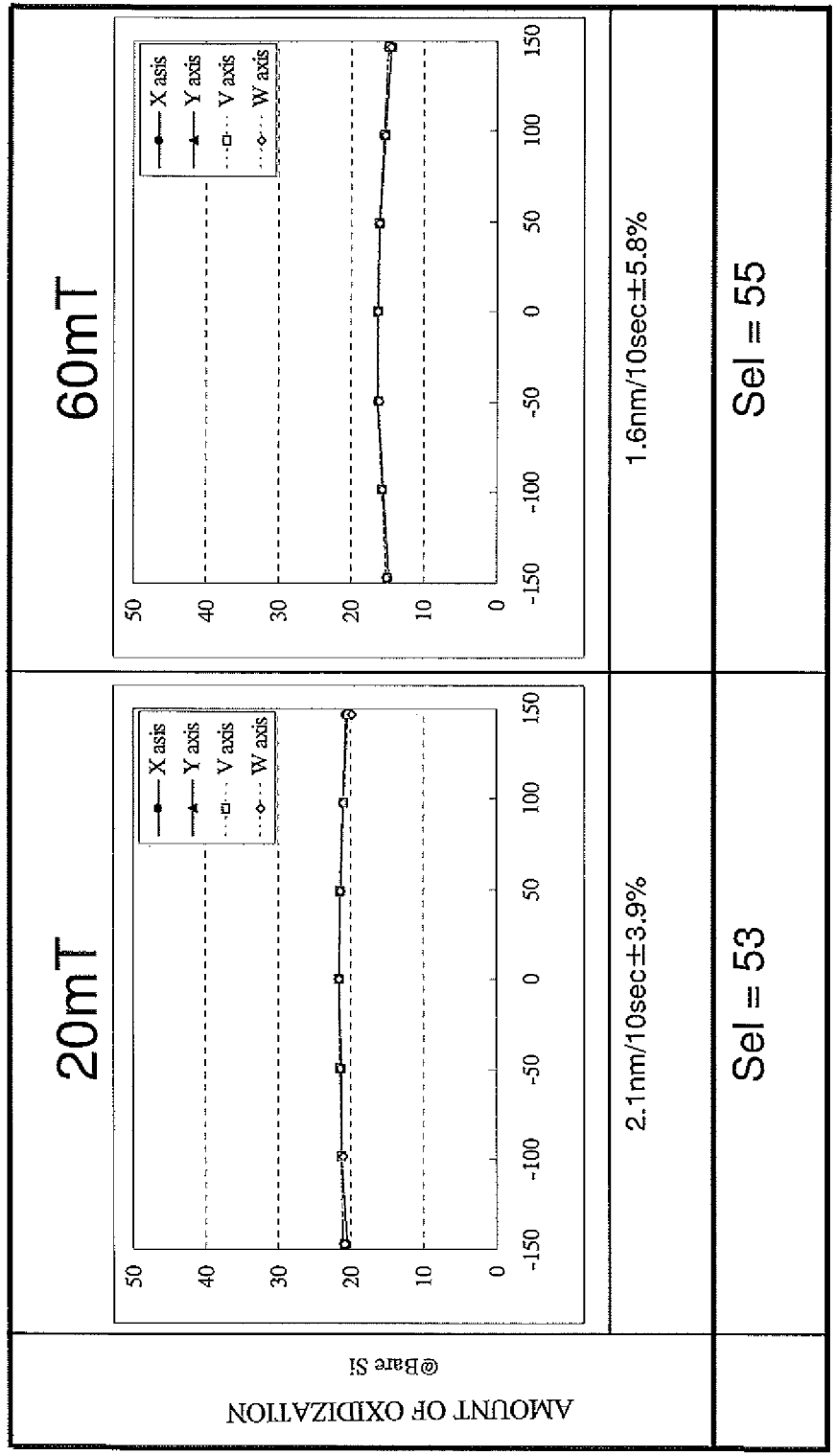

SEMICONDUCTOR DEVICE, METHOD FOR FABRICATING THE SAME AND APPARATUS FOR FABRICATING THE SAME

BACKGROUND OF THE INVENTION

1. Field of the Invention

The present invention relates to a semiconductor device, a method for fabricating the semiconductor device, and an apparatus for fabricating the semiconductor device.

2. Discussion of the Background

Japanese Patent Application Publication No. 10-22382 discloses a method for fabricating semiconductor devices. In this method, a metal wiring is formed on a semiconductor substrate. Then, a plasma TEOS film is formed on the semiconductor substrate to cover the metal wiring. After an organic SOG film is formed on the plasma TEOS film, the organic SOG film is etched back. During the etching, material X is deposited on the organic SOG film and the plasma TEOS film. In order to remove the deposited material X, oxygen plasma of 2.2 torr is applied. The contents of this publication are incorporated herein by reference in their entirety.

SUMMARY OF THE INVENTION

According to one aspect of the present invention, a method for fabricating a semiconductor device includes forming a gate electrode on a surface of a substrate via a gate insulating film, forming an insulating film on a side surface of the gate electrode, and exposing an oxygen plasma onto the surface of the substrate. An electron temperature of the oxygen plasma in a vicinity of the surface of the substrate is equal to or less than about 1.5 eV. The insulating film may be an offset spacer, a side wall spacer, or the side wall spacer formed on the offset spacer.

According to another aspect of the present invention, a semiconductor device includes a semiconductor substrate having a source region and a drain region. A gate electrode is formed on a surface of the semiconductor substrate via a gate insulating film. An insulating film is formed on a side surface of the gate electrode. An area of the surface on the source region and the drain region contains substantially no oxidized portion.

According to further aspect of the present invention, an apparatus for fabricating a semiconductor device includes a unit which is configured to form a gate electrode on a surface of a substrate via a gate insulating film, a unit which is configured to form an insulating film on a side surface of the gate electrode, and a unit which is configured to expose an oxygen plasma onto the surface of the substrate. The insulating film may be an offset spacer, a side wall spacer, or the side wall spacer formed on the offset spacer. An electron temperature of the oxygen plasma in a vicinity of the surface of the substrate is equal to or less than about 1.5 eV.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2A-2D show deposition removal rates and oxidization amounts under different pressures;

DESCRIPTION OF THE EMBODIMENTS

Figure 1A:
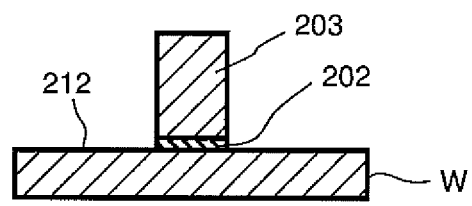
FIGS. 1A-1G are illustrations explaining a method for fabricating a semiconductor device according to an embodiment of the present invention.
Figure 1B:
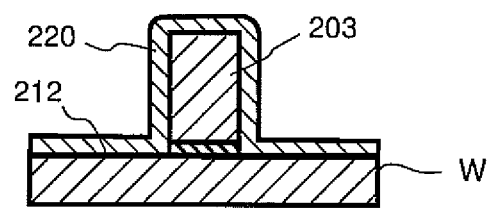

The embodiments will now be described with reference to the accompanying drawings, wherein like reference numerals designate corresponding or identical elements throughout the various drawings.

Referring to FIGS. 1A to 1G, a method for fabricating a semiconductor device, for example, a MOSFET, according to an embodiment of the present invention is explained. Referring to FIG. 1A, a gate electrode 203 made of poly Si is formed on a surface 212 of a substrate W via a gate insulating film 202, for example, a silicon oxide ($SiO_2$) film. Then, referring to FIG. 1B, a silicon oxide ($SiO_2$) 220 is deposited on the gate electrode 203 and the surface 212 using chemical vapor deposition in an RLSA CVD apparatus by supplying gas, for example, Si containing gas such as $SiH_4$ and oxygen gas. The RLSA CVD apparatus includes a Radial Line Slot Antenna.

Then, the silicon substrate W is transferred to an RLSA etching apparatus. In the RLSA etching apparatus, the deposited silicon oxide ($SiO_2$) is etched to form an offset spacer 204 on a side surface of the gate electrode 203 (See FIG. 1C). This etching process has two steps. Table 1 shows the conditions in the first and second steps. The timing to stop each step is determined based on the durations during which the first and second steps are performed, respectively. After the first etching process, the deposited material having a thickness of about 1 nm to about 2 nm is left. In the second etching process, almost all deposited material to be etched is removed.

During the first and second steps, the power of microwave may be from about 1,500 W to about 4,000 W, the pressure may be from about 5 mtorr to about 200 mtorr, the bias of a susceptor may be from about 30 W to about 200 W, and the temperature of the susceptor on which the silicon substrate W is held may be from about 0° C. to about 80° C. The gas to be utilized may be, for example, $CHF_3$, $CH_2F_2$, $O_2$, $N_2$, and/or $H_2$. The gas utilized for etching is determined according to material to be etched. The duration of the etching process may depend on the thickness of the film to be etched. For example, it takes 1 minute to etch 5 nm. However, the maximum duration should be within about 3 minutes.

TABLE 1

|  | Gas to be utilized | |
| --- | --- | --- |
|  | First Step<br>$CH_2F_2$: 1000 sccm<br>$O_2$: 5 sccm<br>Ar: 2 sccm | Second Step<br>$CH_2F_2$: 360 sccm<br>$O_2$: 20 sccm<br>Ar: 2 sccm |
| Microwave Power | 2000 W | 2000 W |
| Pressure | 20 mT | 10 mT |
| Bias | 150 W | 90 W |

Bonding energy between Si and Si in the surface of the silicon substrate is smaller than bonding energy between Si and O in the silicon oxide film to be etched. Accordingly, the surface of the silicon substrate is etched more easily. Also, bonding energy between Si and Si is smaller than bonding energy between Si and N in the silicon nitride film to be etched. So, Si substrate is more easily etched than SiN. As substrate having both $SiO_2$ and Silicon exposed is subject to etching, $SiO_2$ is to be etched while Si is being protected, therefore, high selectivity to the film to be etched is required in the process. SiN as a sidewall spacer can be utilized, where high etching selectivity of SiN and Silicon is required.

In the present embodiment, both the first etching step and the second etching step with different etching conditions are performed shown in Table 1. In the present process, gas which mainly contributes to deposition and other gas mainly contributes to etching are used to balance deposition and etching to protect Si surface. Accordingly, deposition (mainly CFx) is accumulated on the surface, while the etching is performed. Thus, the surface of the silicon substrate is substantially prevented from being etched. Consequently, the surface of the silicon substrate is protected during the etching process.

The deposition is a reaction product (mainly CFx) which includes at least carbon and fluorine. Generally, CFx deposition is removed using a gas containing oxygen. Ashing has been utilized for removing such deposition. In the ashing process, relatively thick oxidation area is formed. It is, therefore, necessary to prevent the surface of the silicon substrate from oxidization during ashing process.

Figure 1C:
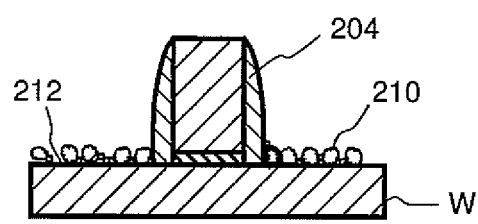
Figure 1D:
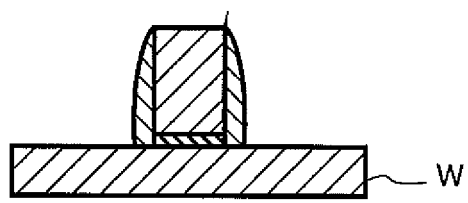

During the etching process, deposition 210 is deposited on the surface 212 under which the substrate W is made of Si (see FIG. 1C). In order to remove the deposition 210, an oxygen plasma is flashed onto the surface 212 of the substrate W in the RLSA etching apparatus after the etching process. During the $O_2$ flash, oxygen plasma is flashed under the condition as shown in Table 2.

TABLE 2

| | |
|---|---|
| Gas to be utilized | $O_2$(350 sccm) |
| Power | 2000 W |
| Pressure | 100 mTorr or more |
| Bias | None |
| Susceptor Temperature | About 20° C.-about 30° C. |
| Time | 5 s |

The temperature of the susceptor on which the silicon substrate W is placed is from about 20° C. to about 30° C. During the $O_2$ flash, the power may be from about 2,000 W to about 3,000 W, the pressure may be about 100 mtorr or more. The electron temperature of the oxygen plasma in the vicinity of the surface 212 of the silicon substrate W, for example, the electron temperature of the oxygen plasma at 20 mm from the surface 212 of the silicon substrate W is preferably from about 1 eV to about 1.5 eV (the plasma potential is about 5 eV to 7 eV). More preferably, the electron temperature of the oxygen plasma at 20 mm from the surface 212 of the silicon substrate W is from about 1 eV to about 1.2 eV. Generally, the plasma potential is about three to five times of the electron temperature of the plasma. Thus, when the electron temperature of the plasma is from 1.0 eV to 1.5 eV, the plasma potential is from about 3 eV to about 7.5 eV. When the electron temperature of the plasma is from 1.0 eV to about 1.2 eV, the plasma potential is from about 3 eV to 6 eV. Plasma potential is measured, for example, at a measuring position which is about 10 mm above from the surface 212 of the silicon substrate. The measuring position is, for example, on the chamber wall side. It is noted that the plasma potential varies in accordance with the bias potential which is applied to the susceptor. However, according to the embodiment of the present invention using $O_2$ flash, the bias is not applied to the susceptor. Accordingly, the variation caused by the bias may not be considered. If the electron temperature of oxygen plasma in the vicinity of the surface 212 of the silicon substrate W is high, the surface 212 of the silicon substrate W is more oxidized during the $O_2$ flash and is damaged. Thus, an area of the surface 212 on the source region and the drain region contains oxidized portion (unintended recess). Due to this oxidized portion, a semiconductor device cannot be manufactured as designed.

Figure 2A:
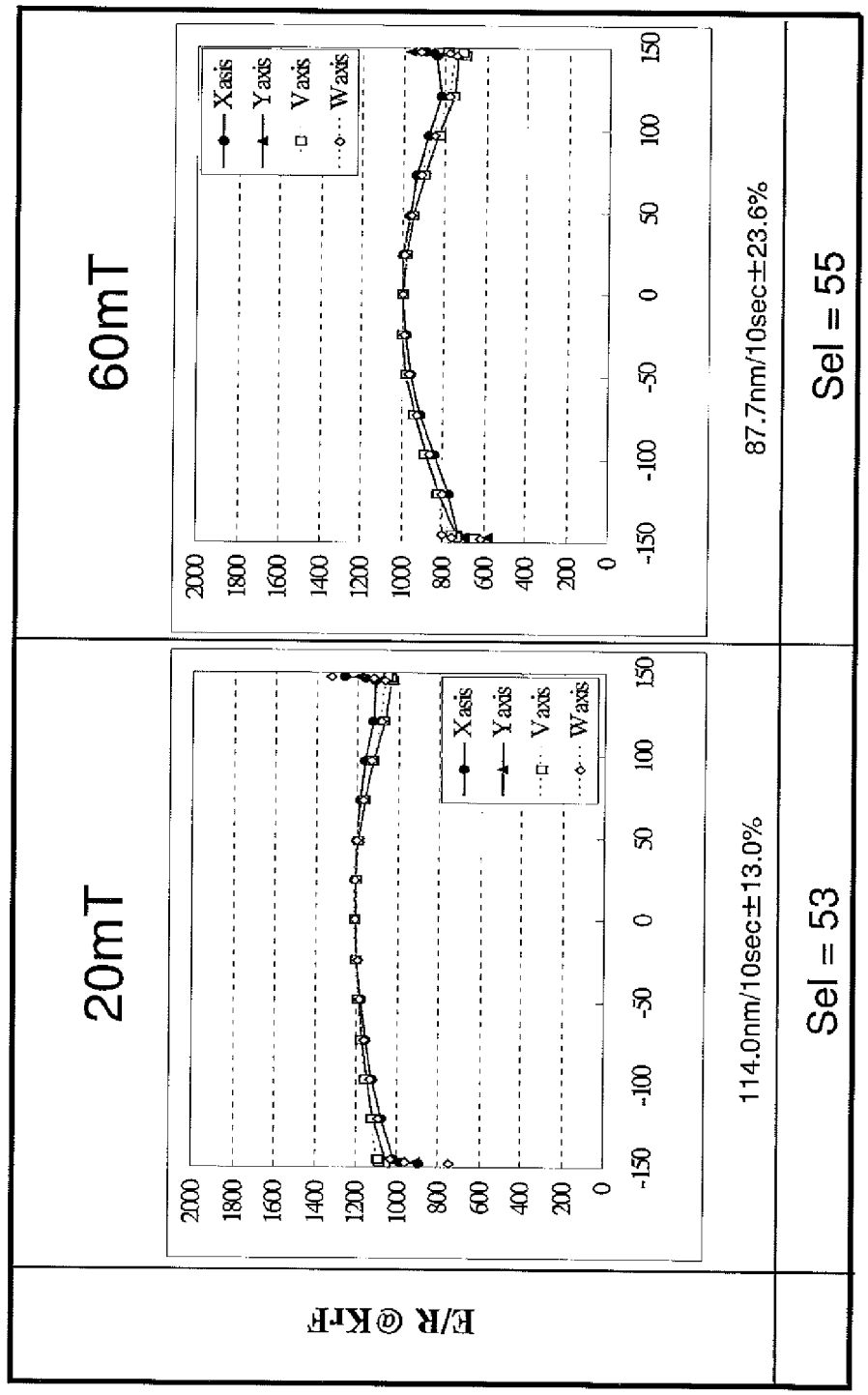
Figure 2B:
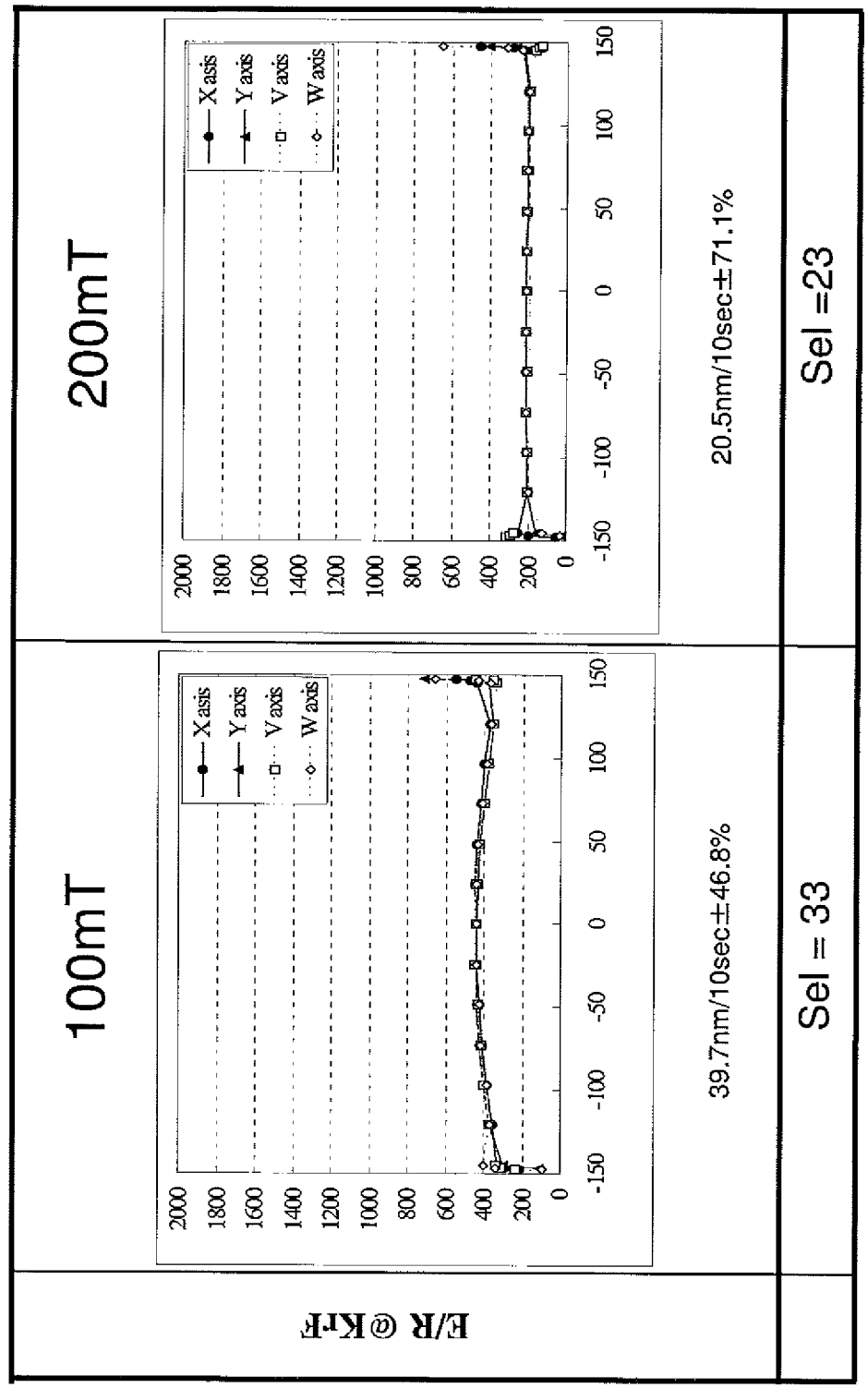
Figure 2D:
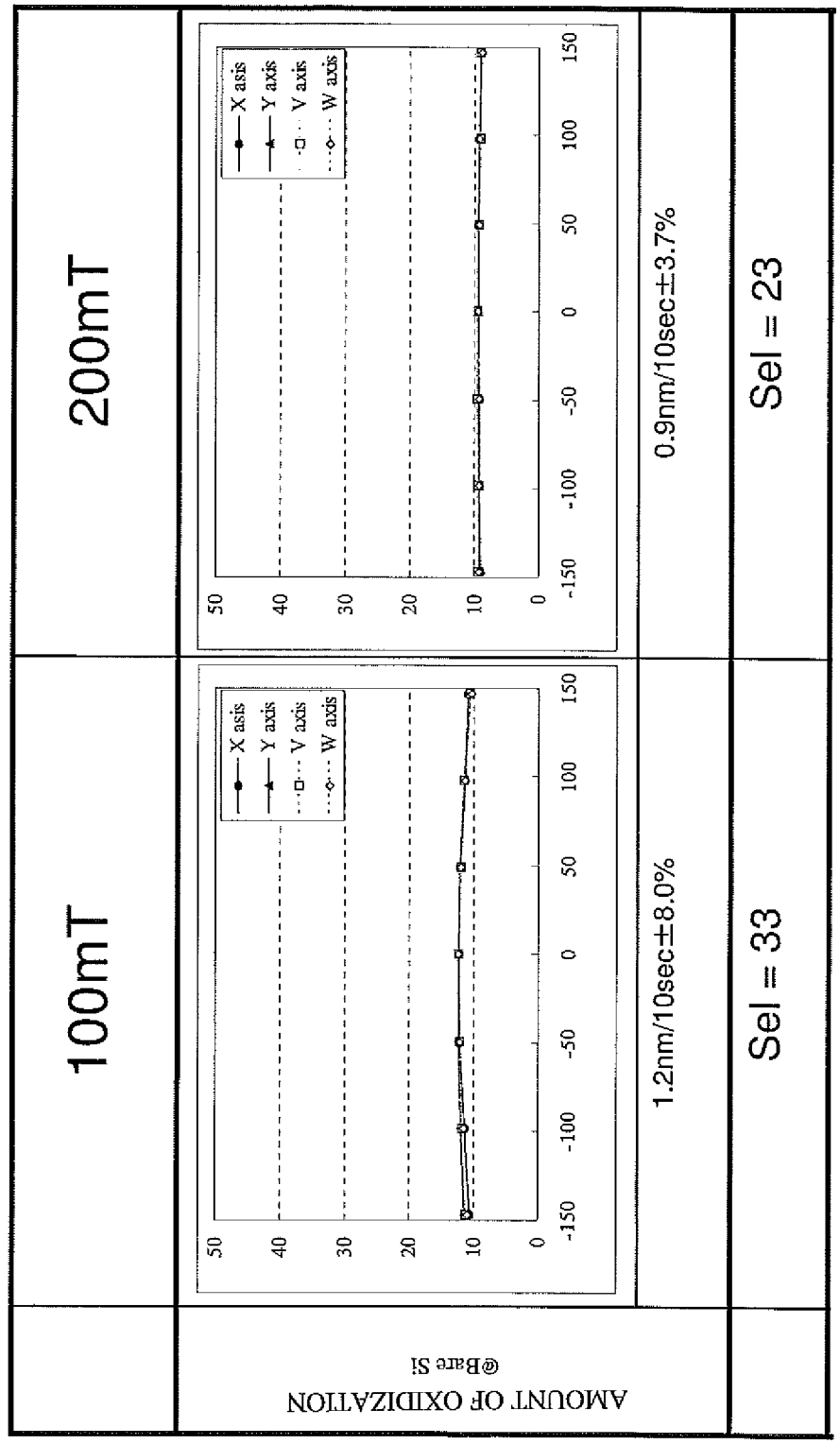

FIGS. 2A and 2B show deposition removal rates under different pressures. For measuring the deposition removal rates, etching ($O_2$ flash) is performed for 10 seconds by applying microwave which has power of 3,000 W to KrF resist (deposition). In this experiment, KrF resist is assumed to be the deposition. FIGS. 2C and 2D show oxidization amounts under different pressures. For measuring the oxidization amounts, etching ($O_2$ flash) is performed for 10 seconds by applying microwave which has power of 3,000 W to a bare silicon substrate. The oxidization amount is an amount of oxidization in the silicon substrate. In FIGS. 2A-2D, the unit of the abscissa axis is "mm" and the unit of the vertical axis is Å.

According to the left side of FIG. 2A and the left side of FIG. 2C, under 20 mT, the oxidization amount is kept to be high while the deposition removal rate is maintained to be high. In order to decrease the oxidization amount, the $O_2$ flash may be performed under higher pressure than 20 mT.

According to the left side of FIG. 2C, under 20 mT, the oxidization amount is 2.1 nm/10 sec±3.9% (2.1 nm thick for 10 seconds). In the embodiment according to the present invention, the $O_2$ flash is performed for 5 seconds. Accordingly, in the embodiment, the oxidization amount should be 1.05 nm.

According to the right side of FIG. 2A and the right side of FIG. 2C, under 60 mT, the oxidization amount is still kept to be high while the deposition removal rate is maintained to be high. In order to decrease the oxidization amount, the $O_2$ flash may be performed under still higher pressure than 60 mT.

According to the right side of FIG. 2C, under 60 mT, the oxidization amount is 1.6 nm/10 sec±5.8% (1.6 nm thick for 10 seconds). In the embodiment according to the present invention, the $O_2$ flash is performed for 5 seconds. Accordingly, in the embodiment, the oxidization amount should be 0.8 nm.

According to the left side of FIG. 2B and the left side of FIG. 2D, under 100 mT, the oxidization amount is kept to be low while the deposition removal rate is maintained to be high. In order to decrease the oxidization amount, the $O_2$ flash may be performed under yet higher pressure.

According to the left side of FIG. 2D, under 100 mT, the oxidization amount is 1.2 nm/10 sec±8.0% (1.2 nm thick for 10 seconds). In the embodiment according to the present invention, the $O_2$ flash is performed for 5 seconds. Accordingly, in the embodiment, the oxidization amount should be 0.6 nm.

According to the right side of FIG. 2B and the right side of FIG. 2D, under 200 mT, the oxidization amount is kept to be low while the deposition removal rate is maintained to be high. Thus, as in the case of 100 mT, since the oxidization amount is low, the $O_2$ flash may be performed under 200 mT.

According to the right side of FIG. 2D, under 200 mT, the oxidization amount is 0.9 nm/10 sec±3.7% (0.9 nm thick for 10 seconds). In the embodiment according to the present invention, the $O_2$ flash is performed for 5 seconds. Accordingly, in the embodiment, the oxidization amount should be 0.45 nm.

In fact, native oxidized film is formed unintentionally on the silicon substrate because the silicon substrate is exposed to oxygen when the silicon substrate is transferred. The thickness of the native oxidized film is about 1 nm.

Note that the thickness of the oxidized film is not simply doubled even though the $O_2$ flash is performed twice. Instead of increasing the thickness, the concentration of $SiO_2$ may increase.

In the present embodiment, the electron temperature of the oxygen plasma, for example, at 20 mm from the surface 212 of the silicon substrate W is enough low not to oxidize a deep oxidized portion in the area of the surface 212 on the source region and the drain region on the silicon substrate W. According to the present embodiment, substantially no oxidized portion is formed in the area of the surface 212 on the source region and the drain region during the $O_2$ flash (See FIG. 1D). According to the present embodiment, even if the oxidized portion is formed in the area of the surface 212 on the source region and the drain region during the $O_2$ flash, preferably, the thickness of the oxidized portion may be less than about 1 nm.

In the present embodiment, the $O_2$ flash is performed in the RLSA etching apparatus in which the etching process also has been performed. Accordingly, deterioration of the film formed on the silicon substrate W can be substantially prevented because the silicon substrate W is not exposed to the atmosphere when the silicon substrate W is transferred from one processing chamber for etching to another processing chamber for $O_2$ flash and the etching deposition can be removed before another processing chamber.

Figure 1E:
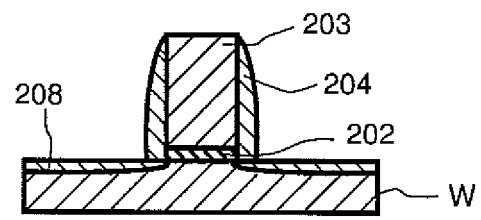
Figure 1F:
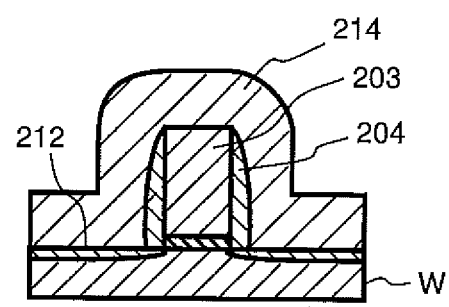

Phosphorus ion is implanted into the silicon substrate W to form an extension 208 (see FIG. 1E). Then, in order to form a side wall spacer 216, an oxide film or a nitride film, for example, an SiN film 214 is formed on the surface of the silicon substrate W to cover the surface 212 and the gate electrode 203 with the offset spacer 204 (see FIG. 1F). SiN is deposited on the surface of the silicon substrate W using chemical vapor deposition in the RLSA CVD apparatus. The thickness of the SiN film 214 is determined based on the length of the extension. Then, in the RLSA etching apparatus, the deposited SiN is etched to form the side wall spacer 216 at the side of the gate electrode 203 (see FIG. 1G).

During the etching process, the deposition 210 is deposited on the surface 212 under which the substrate W is made from Silicon. In order to remove the deposition 210, an oxygen plasma is flashed onto the surface 212 of the substrate W in the RLSA etching apparatus after the etching process. During the $O_2$ flash, oxygen plasma is flashed under the condition as shown in Table 2.

The temperature of the susceptor on which the silicon substrate W is placed is from about 20° C. to about 30° C. During the $O_2$ flash, the power may be from about 2,000 W to about 3,000 W, the pressure may be about 100 mtorr or more. The electron temperature of the oxygen plasma in the vicinity of the surface 212 of the silicon substrate W, for example, the electron temperature of the oxygen plasma at 20 mm from the surface 212 of the silicon substrate W is preferably from about 1 eV to about 1.5 eV. More preferably, the electron temperature of the oxygen plasma at 20 mm from the surface 212 of the silicon substrate W is from about 1 eV to about 1.2 eV. If the electron temperature of oxygen plasma in the vicinity of the surface 212 of the silicon substrate W is high, the surface 212 of the silicon substrate W is easily oxidized during the $O_2$ flash. Thus, an area of the surface 212 on the source region and the drain region contains oxidized portion (unintended recess). Due to this oxidized portion, a semiconductor device cannot be manufactured as designed.

In the present embodiment, the electron temperature of the oxygen plasma, for example, at 20 mm from the surface 212 of the silicon substrate W is enough low not to oxidize a deep oxidized portion in the area of the surface 212 on the source region and the drain region. According to the present embodiment, substantially no oxidized portion is formed in the area of the surface 212 on the source region and the drain region during the $O_2$ flash (See FIG. 1G). According to the present embodiment, even if the oxidized portion is formed in the area of the surface 212 on the source region and the drain region during the $O_2$ flash, preferably, the thickness of the oxidized portion may be less than about 1 nm.

Figure 1G:
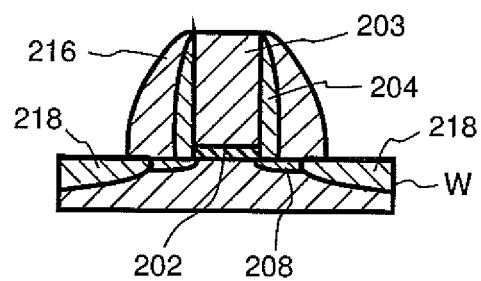

Then, arsenic ion is implanted into the silicon substrate W to form source/drain region (see FIG. 1G). Due to the thickness of the side wall spacer 216, a source/drain region 218 having high concentration is formed outside the extension 208.

According to the above explained method, for example, a MOSFET as shown in FIG. 1G is fabricated. This semiconductor device has a source region and a drain region 218. The thickness of the oxidized portion in the area of the surface 212 on the source region and the drain region 218 may be substantially less than about 1 nm.

In the present embodiment, both the offset spacer 204 and the side wall spacer 216 are formed and the $O_2$ flash process is performed two times. However, only the side wall spacer 216 may be formed without forming the offset spacer 204. In this case, the $O_2$ flash process is performed only once.

For example, the $O_2$ flash is performed by using a plasma processing apparatus. Any plasma processing apparatus which is capable of generating oxygen plasma having low electron temperature of about 1.5 eV or less in the vicinity of the silicon substrate W can be utilized for performing $O_2$ flash. As an example, an RLSA etching apparatus is explained below.

Figure 3:
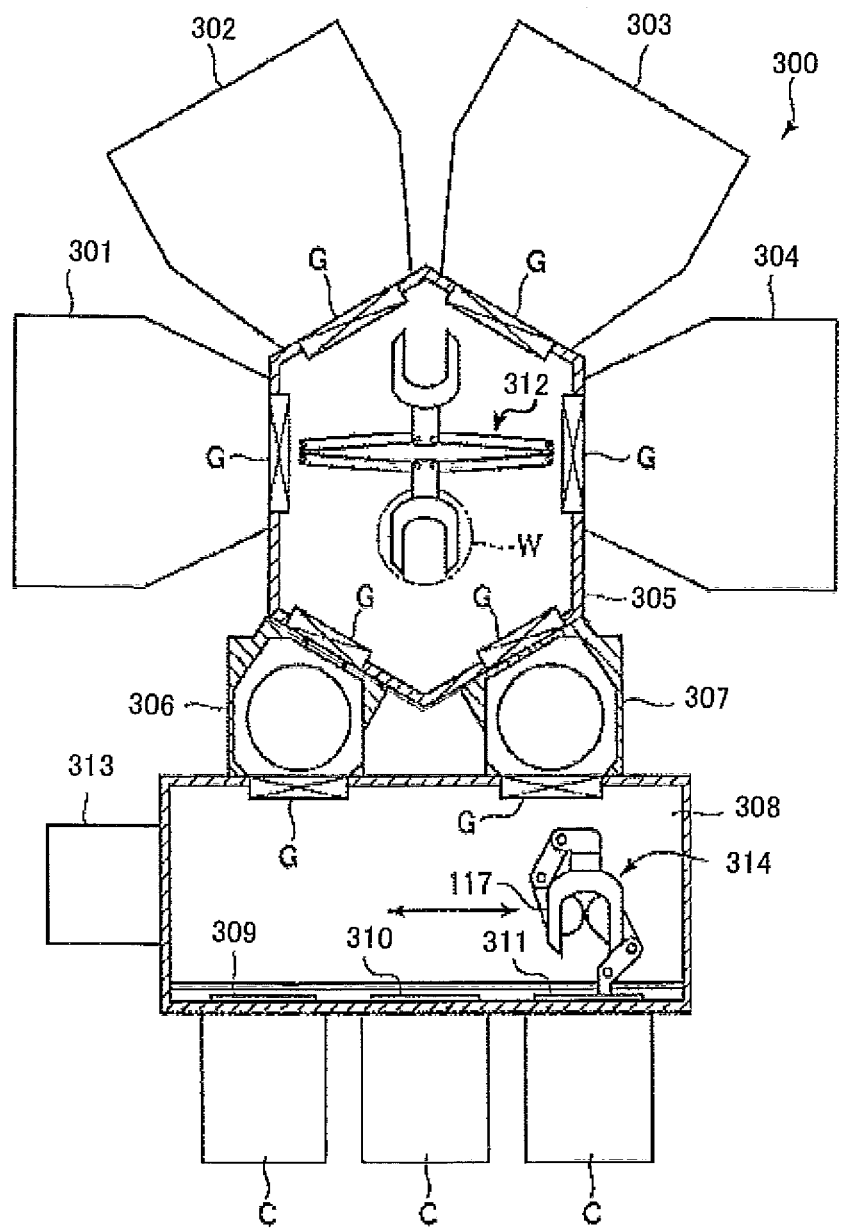
FIG. 3 is a schematic plan view showing an apparatus for fabricating a semiconductor device according to an embodiment of the present invention.

FIG. 3 shows a system 300 for fabricating the semiconductor device. The system 300 includes processing apparatuses 301, 302, 303 and 304, a transfer chamber 305, load lock modules 306 and 307, a loader chamber 308, shutters 309, 310 and 311, a first transfer mechanism 312, an orientation unit 313, and a second transfer mechanism 314. This kind of system is normally called "Cluster Tool" having the several processing apparatuses 301, 302, 303 and 304 around the transfer chamber 305. Each processing apparatus may be selected depending on the desired process, such as etching, film forming and other treatments. A substrate W is transferred into the processing apparatus 301, 302, 303, 304 from a cassette C by the second transfer mechanism 314 in the loader chamber 308, then to a processing apparatus by the first transfer mechanism 312 in the transfer chamber 305 in which the predetermined process is carried out in a vacuum state. While processing the substrate W, interior spaces of the processing apparatuses 301, 302, 303 and 304 and the transfer chamber 305 are evacuated by respective evacuation pumps (not shown) and maintained in a predetermined vacuum state. After the process is completed, the substrate is returned to the cassette C. Further details of the processing apparatus will be described later.

Figure 4:
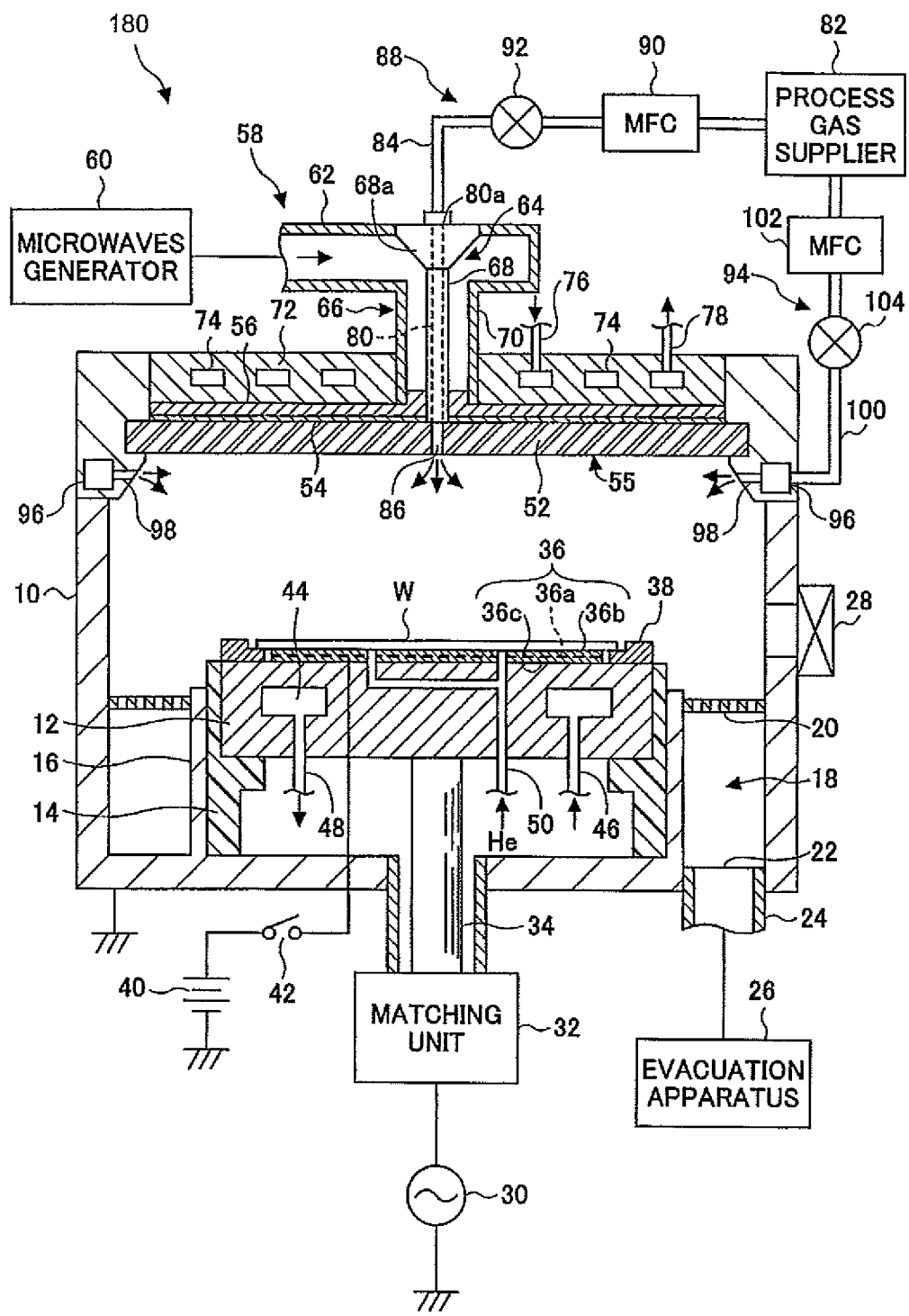
FIG. 4 is a schematic cut-open view of an RLSA etching apparatus.

FIG. 4 shows a schematic cut-open view of the RLSA etching apparatus 180. Referring to FIG. 4, the microwave plasma etching apparatus 180, which is configured as a planar Surface Wave Plasma type plasma processing apparatus, has a cylinder-shaped chamber (process chamber) 10 made of metal such as aluminum or stainless steel. The chamber 10 is grounded for security reasons.

First, components or members, which do not directly contribute to generating the microwave plasma in the chamber 10 of the microwave plasma etching apparatus 180, are described.

In a lower center portion of the chamber 10, there is a susceptor 12 on which a semiconductor substrate W (referred to as a substrate W below) is placed. The susceptor 12 is horizontally held by a cylindrical supporting portion 14 extending upward from the bottom of the chamber 10. The cylindrical supporting portion 14 is made of an insulating material. Additionally, the susceptor 12 is shaped into a circular plate and made of, for example, aluminum, serving also as a lower electrode to which radio frequency waves are applied.

A ring-like evacuation pathway 18 is provided between the inner wall of the chamber 10 and another cylindrical supporting portion 16 that extends upward from the bottom of the chamber 10 and along the outer circumferential surface of the cylindrical supporting portion 14. The cylindrical supporting portion 16 is electrically conductive. A ring-like baffle plate 20 is arranged at a top portion (or an inlet portion) of the evacuation pathway 18, and an evacuation port 22 is provided below the evacuation pathway 18. In order to obtain uniform gas flow patterns distributed symmetrically in relation to the substrate W on the susceptor 12 in the chamber 10, plural of the evacuation ports 22 are preferably provided at equal angular intervals along a circumferential direction. Each of the evacuation ports 22 is connected to an evacuation apparatus 26 through an evacuation pipe 24. The evacuation apparatus 26 may have a vacuum pump such as a turbo molecular pump (TMP), which can evacuate the chamber 10 to a desired reduced pressure. A gate valve 2B is attached on an outer wall of the chamber 10. The gate valve 28 opens and closes a transport opening through which the substrate W is transported into or out from the chamber 10.

The susceptor 12 is electrically connected to a radio frequency power supply 30 that applies an RF bias voltage to the susceptor 12 through a matching unit 32 and a power feeding rod 34. The power supply 30 outputs, at a predetermined electric power level, radio frequency waves having a relatively low frequency of, for example, 13.56 MHz. Such a low frequency is suitable to control the energy of ions to be attracted to the substrate W on the susceptor 12. The matching unit 32 includes a matching element for matching output impedance of the power supply 30 with impedance of a load including the electrode (susceptor), the plasma produced in the chamber 10, and the chamber 10. The matching element has a blocking condenser for generating self bias.

An electrostatic chuck 36 is provided on the upper surface of the susceptor 12. The electrostatic chuck 36 holds the substrate W by electrostatic force on the susceptor 12. The electrostatic chuck 36 has an electrode 36a formed of an electroconductive film and a pair of insulating films 36b, 36c that sandwich the electrode 36a. A DC power supply 40 is electrically connected to the electrode 36a via a switch 42. The DC voltage applied to the electrostatic chuck 36 from the DC power supply 40 produces a Coulomb force, which in turn holds the substrate W onto the electrostatic chuck 36. Outside the electrostatic chuck 36, a focus ring 38 is provided in order to surround the substrate W.

A cooling medium chamber 44 is provided inside the susceptor 12. The cooling medium chamber 44 has a ring-shape extending in a circumferential direction. A cooling medium or cooling water at a predetermined temperature is supplied to the cooling medium chamber 44 through conduits 46, 48 from a chiller unit (not shown) so as to circulate through the cooling medium chamber 44 and the conduits 46, 48. Due to the temperature-controlled cooling medium or the like, the temperature of the substrate W on the electrostatic chuck 36 may be controlled. In addition, a thermal conduction gas such as He gas is supplied between the substrate W and the electrostatic chuck 36 through a gas supplying pipe 50 from a thermal conduction gas supplying portion (not shown). Moreover, the chamber 10 is provided with elevatable lift pins (not shown) that vertically penetrate the susceptor 12 and raise/lower the substrate W when the substrate W is loaded into or unloaded from the chamber 10. The lift pins may be driven by an elevation mechanism (not shown).

Next, components or members which contribute to generating the microwave plasma in the chamber 10 of the microwave plasma etching apparatus 180 are described. A planar antenna 55 is provided above the susceptor 12 in order to introduce the microwaves into the chamber 11.

The planar antenna 55 includes a circular quartz plate 52 as a dielectric window and a circular radial line slot antenna (RLSA) 54. Specifically, the quartz plate 52 is hermetically attached to the chamber 10 and serves as a ceiling surface of the chamber 11 that opposes the susceptor 12. The RLSA 54 is located on the upper surface of the quartz plate 52, and has plural slots distributed along concentric circles. The RLSA 54 is electromagnetically coupled to a microwave transmission line 58 via a wavelength shortening plate 56 formed of a dielectric material, for example, quartz.

The microwave transmission line 58 has a waveguide pipe 62, a waveguide pipe/coaxial pipe converter 64, and a coaxial pipe 66, and transmits the microwaves output from a microwave generator 60 to the RLSA 54. The waveguide pipe 62 is formed of, for example, a square pipe, and transmits the microwaves in a TE mode from the microwave generator 60 through the waveguide pipe-coaxial pipe converter 64.

The waveguide pipe/coaxial pipe converter 64 couples the waveguide pipe 62 with the coaxial pipe 66, and converts the TE mode microwaves in the waveguide pipe 62 to TEM mode microwaves in the coaxial pipe 66. The converter 64 preferably has a larger diameter at an upper portion connected to the waveguide pipe 62, and a smaller 30 diameter at a lower portion connected to an inner conductor 68 of the coaxial pipe 66 in order to avoid a concentrated electromagnetic field, which may be present at high power transmission levels. In other words, the converter 64 is preferably shaped into an inverted cone (or a door knob) as shown in FIGS. 14 and 15. The converter 64 may be referred to as an inverted cone portion 68a for simplicity of explanation below.

The coaxial pipe 66 extends vertically downward from the converter 64 to an upper center portion of the chamber 10 and is coupled with the RLSA 54. Specifically, the coaxial pipe 66 has an outer conductor 70 and the inner conductor 68. The outer conductor 70 is connected to the waveguide pipe 62 at the upper end and extends downward so as to reach the slow wave plate 56. The inner conductor 68 is connected to the converter 64 at the upper end and extends downward so as to reach the RLSA 54. The microwaves propagate in the TEM mode between the inner conductor 68 and the outer conductor 70.

The microwaves output from the microwave generator 60 are transmitted through the microwave transmission line 58 including the waveguide pipe 62, the converter 64, and the coaxial pipe 66, and are supplied to the RLSA 54 passing through the slow wave plate 56. Then, the microwaves are spread in a radial direction in the slow wave plate 56 and emitted toward the chamber 10 through the slots of the RLSA 54. The microwaves emitted through the slots propagate along the lower surface of the quartz plate 52 as surface waves, and ionize gas near the lower surface of the quartz plate 52, thereby generating plasma in the chamber 10.

An antenna back surface plate 72 is provided on the upper surface of the slow wave plate 56. The antenna back surface plate 72 is made of, for example, aluminum. The antenna back surface plate 72 contains fluid conduits 74 to which a chiller unit (not shown) is connected so that a cooling medium or cooling water at a predetermined temperature is circulated through the conduits 74 and pipes 76, 78. Namely, the antenna back surface plate 72 serves as a cooling jacket that absorbs heat generated in the quartz plate 52 and transfers the heat to the outside.

As shown in FIG. 4, a gas conduit 80 is provided so as to go through the inner conductor 68 of the coaxial pipe 66 in this embodiment. In addition, a first gas supplying pipe 84 (FIG. 4) is connected at one end to an upper opening of the gas conduit 80 and at the other end to a process gas supplier 82. Moreover, a gas ejection opening 86 is formed at the center portion of the quartz plate 52 and open to the chamber 10. In a first process gas introduction portion 88 having the above configuration, the process gas from the process gas supplier 82 flows through the first gas supplying pipe 84 and the gas conduit 80 in the coaxial pipe 66, and is ejected from the gas ejection opening 86 toward the susceptor 12 located below the gas ejection opening 86. The ejected process gas is spread outward in a radial direction in the chamber 10, partly because the process gas is pulled toward the evacuation pathway 18 surrounding the susceptor 12 by the evacuation apparatus 26. By the way, the first gas supplying pipe 84 is provided with a mass flow controller (MFC) 90 and an on-off valve 92 in the middle.

In this embodiment, a second process gas introduction portion 94 is provided in addition to the first process gas introduction portion 88 in order to introduce the process gas to the chamber 10. The second process gas introduction portion 94 includes a buffer chamber 96, plural side ejection holes 98, and a gas supplying pipe 100. The buffer chamber 98 is shaped into a hollow ring that extends inside the side wall portion of the chamber 10 and along a circumferential direction of the side wall portion, and is located slightly lower than the quartz plate 52. The plural side ejection holes 98 are open toward the plasma region in the chamber 10, arranged at equal angular intervals along an inner wall of the chamber 10, and in gaseous communication with the buffer chamber 96. The gas supplying pipe 100 connects the buffer chamber 96 to the process gas supplier 82. The gas supplying pipe 100 is provided with an MFC 102 and an on-off valve 104 in the middle.

In the second process gas introduction portion 94, the process gas from the process gas supplier 82 is introduced into the buffer chamber 96 in the side wall portion of the chamber 10 through the second process gas supplying pipe 100. Pressure in the buffer chamber 96 filled with the process gas becomes uniform along the circumferential direction of the buffer chamber 96, which allows the process gas to be uniformly and horizontally ejected from the plural ejection holes 98 toward the plasma region in the chamber 10. In this case, it may be difficult to uniformly distribute the process gas ejected from the ejection holes 98 above the substrate W, because the process gas is pulled toward the evacuation ports 22 when the process gas flows over the evacuation pathway 18. However, since the process gas ejected from the gas ejection opening 86 located at the center of the quartz plate 52 is spread in an outward radial direction and flows toward the evacuation pathway 18 as stated above, the process gas ejected from the side ejection holes 98 is not affected to a great extent by the evacuation apparatus 26 in this embodiment. Therefore, the plasma can be uniformly distributed above the substrate W on the susceptor 12.

The process gases introduced into the chamber 10 respectively from the first process gas introduction portion 88 and the second process gas introduction portion 94 may be the same, or different. Flow rates of the gases can be controlled by the MFCs 90 and 102, respectively, or the gases are introduced into the chamber at a predetermined flow rate ratio, so that the gases and thus the plasma are uniformly distributed in the radial direction.

Figure 5:
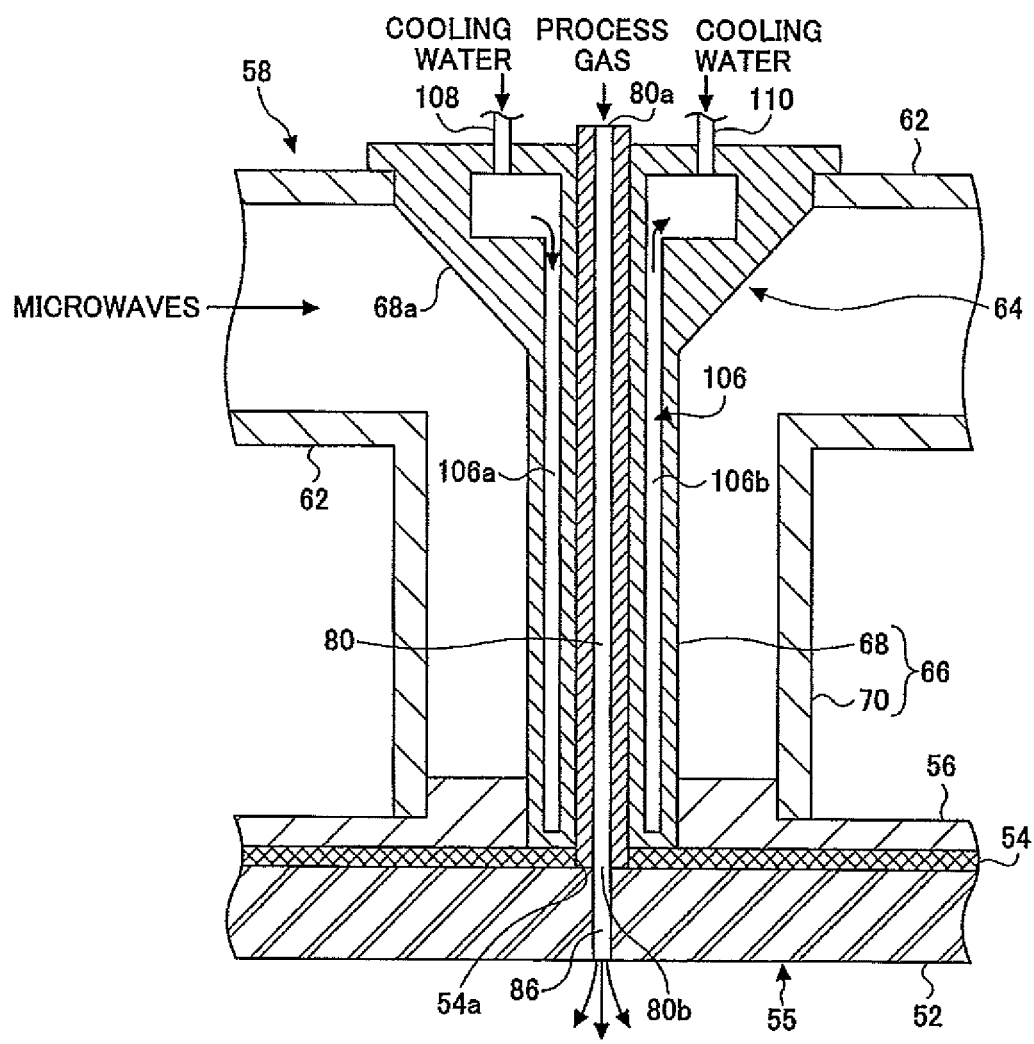
FIG. 5 is a partially enlarged illustration of the RLSA etching apparatus shown in FIG. 4.

Referring to FIG. 5, the waveguide pipe-coaxial pipe converter 64 and the coaxial pipe 66 are shown in detail. The inner conductor 68 is made of, for example, aluminum. The gas conduit 80 penetrates the inner conductor 68 along a center axis of the inner conductor 68. In addition, a cooling medium conduit 106 is formed in parallel with the gas conduit 80.

The cooling medium conduit 106 includes an incoming path 106a and an outgoing path 106b that are divided by a vertical partition (not shown). In the upper portion of the inverse cone portion 68a, a pipe 108 is connected to the incoming path 106a of the cooling medium conduit 106. The opposite end of the pipe 108 is connected to a chiller unit (not shown). In addition, a pipe 110 is connected to the outgoing path 106b of the cooling medium conduit 106. The opposite end of the pipe 110 is connected to the same chiller unit. With this configuration, a cooling medium or cooling water supplied from the chiller unit flows downward through the incoming path 106a so as to reach the bottom of the incoming path 106a and returns back upward through the outgoing path 106b so as to flow into the pipe 110. In such a manner, the inner conductor 68 may be cooled.

At the center of the RLSA 54, there is an opening 54a into which the gas conduit 80 is fitted, as shown in FIG. 5. In addition, the opening 54a is located in coaxial alignment with the gas ejection opening 86 of the quartz plate 52. With this configuration, the electromagnetic waves (microwaves) radiated from the RLSA 54 do not reach the gas ejection opening 86, and thus no discharging takes place in the gas ejection opening 86. By the way, the gas ejection opening 86 may be branched into plural holes in the quartz plate 52. The plural holes may be located within a certain range in the radial direction of the quartz plate 52.

Figure 6:
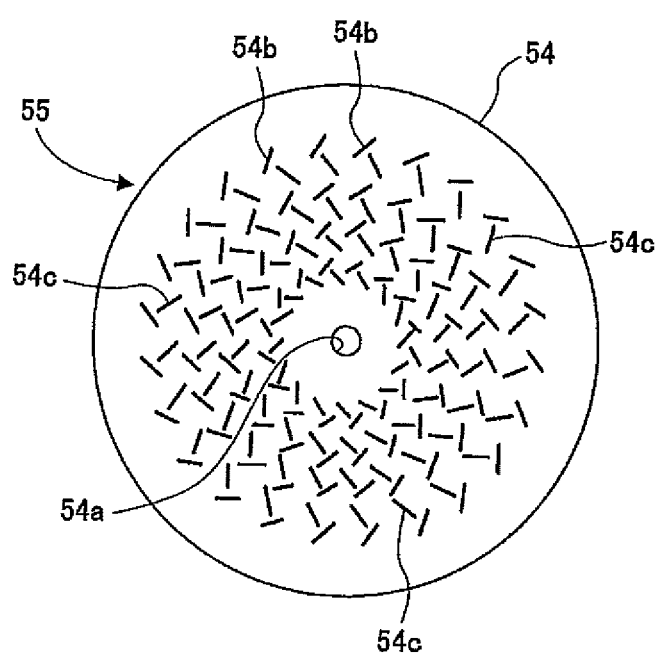
FIG. 6 is a plan view of a slot antenna used in the RLSA etching apparatus shown in FIG. 4.

FIG. 6 shows a slot pattern in the RLSA 54 in this embodiment. As shown, the RLSA 54 has plural slots distributed in concentric circles. Specifically, two kinds of slots 54b, 54c whose longitudinal directions are substantially at right angles are distributed in alternating concentric circles. These concentric circles are arranged at radial intervals depending on wavelengths of the microwaves propagating in the radial direction of the RLSA 54. According to such a slot pattern, the microwaves are converted into circularly polarized planar waves having two polarization components intersecting with each other, and the planar waves are radiated from the RLSA 54. The RLSA 54 configured as described above is advantageous in that the microwaves may be uniformly radiated into the chamber 10 (FIG. 4) from substantially the entire region of the antenna, and suitable to generate uniform and stable plasma.

By the way, various operations of the evacuation apparatus 26, the RF power supplier 30, the switch 42 of the DC power supplier 40, the microwave generator 60, the process gas introduction portions 88, 94, the chiller units (not shown), and the thermal conduction gas supplying portion (not shown), and total operations as a whole are controlled by a controlling portion (not shown) composed of, for example, a microcomputer in the microwave plasma etching apparatus 180 according to the first embodiment of the present invention.

Plasma generated by microwave 2.45 GHz in the apparatus 180 having an electron temperature of several eV directly under the dielectric window diffuses downwardly. Then the electron temperature of the plasma becomes low as about a few eV around the substrate to be processed. As the electron temperature is low, plasma damages are rarely induced into the film on the substrate. Also, high density plasma is realized using RLSA, processing rate can be high.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A method for fabricating a semiconductor device, the method comprising:
   forming a gate electrode on a surface of a substrate via a gate insulating film;
   forming an insulating film on a side surface of the gate electrode, a deposition including a fluorocarbon being generated when the insulating film is formed; and
   exposing an oxygen plasma onto-the surface of the substrate to remove the deposition, an electron temperature of the oxygen plasma in a vicinity of the surface of the substrate being equal to or less than about 1.5 eV.

2. The method for fabricating a semiconductor device according to claim 1, wherein the insulating film is an offset spacer.

3. The method for fabricating a semiconductor device according to claim 2, wherein a sidewall spacer is formed on the offset spacer.

4. The method for fabricating a semiconductor device according to claim 1, wherein the insulating film is a sidewall spacer.

5. The method for fabricating a semiconductor device according to claim 1, wherein exposing the oxygen plasma is performed using surface-wave microwave plasma generated by using a Radial Line Slot Antenna.

6. The method for fabricating a semiconductor device according to claim 1, wherein the oxygen plasma having a pressure of about 100 mtorr or more is flashed.

7. The method for fabricating a semiconductor device according to claim 1, wherein at least one of an offset spacer and a sidewall spacer is formed in a process chamber, and wherein the oxygen plasma is flashed in the process chamber.

8. The method for fabricating a semiconductor device according to claim 1, wherein the oxygen plasma is flashed onto the surface under which the substrate comprises Si.

9. The method for fabricating a semiconductor device according to claim 1, wherein the electron temperature of the oxygen plasma at 20 mm from the surface of the substrate is from about 1.0 eV to about 1.5 eV.

10. The method for fabricating a semiconductor device according to claim 9, wherein the electron temperature of the oxygen plasma at 20 mm from the surface of the substrate is from about 1.0 eV to about 1.2 eV.

11. The method for fabricating a semiconductor device according to claim 1, wherein the substrate is put on a susceptor whose temperature is from about 20° C. to about 30° C. while the oxygen plasma is flashed.

12. The method for fabricating a semiconductor device according to claim 1, wherein microwave power to generate a plasma is from about 2000 W to about 3000 W.

13. An apparatus for fabricating a semiconductor device, the apparatus comprising:
   a unit configured to form a gate electrode on a surface of a substrate via a gate insulating film;
   a unit configured to form an insulating film on a side surface of the gate electrode; and
   a unit configured to expose an oxygen plasma onto the surface of the substrate to remove a deposition including a fluorocarbon which is generated when the insulating film is formed, an electron temperature of the oxygen plasma in a vicinity of the surface of the substrate being equal to or less than about 1.5 eV.

14. The method for fabricating a semiconductor device according to claim 1, wherein the gate electrode is plasma-etched using a gas including a carbon atom and a fluorine atom to form the insulating film on the side surface of the gate electrode.

15. The method for fabricating a semiconductor device according to claim 1, wherein an oxidized portion having a thickness of less than about 1 nm is formed on the surface of the substrate by exposing the oxygen plasma onto the surface of the substrate.

* * * * *